United States Patent [19]

Vitkavage et al.

[11] Patent Number: 5,168,330
[45] Date of Patent: Dec. 1, 1992

[54] SEMICONDUCTOR DEVICE HAVING A SEMICONDUCTOR SUBSTRATE INTERFACED TO A DISSIMILAR MATERIAL BY MEANS OF A SINGLE CRYSTAL PSEUDOMORPHIC INTERLAYER

[75] Inventors: Daniel J. Vitkavage, Zionsville, Pa.; Gaius G. Fountain, Youngsville; Sunil Hattangady, Raleigh; Ronald A. Rudder, Wake Forest; Robert J. Markunas, Chapel Hill, all of N.C.

[73] Assignee: Research Triangle Institute, Research Triangle Park, N.C.

[21] Appl. No.: 620,574

[22] Filed: Dec. 3, 1990

[51] Int. Cl.⁵ .............................................. H01L 29/80
[52] U.S. Cl. ........................... 257/280; 257/471; 257/616
[58] Field of Search ............... 357/22, 22 A, 23.2, 357/23.15; 437/184

[56] References Cited

U.S. PATENT DOCUMENTS 4,961,194 10/1990 Kuroda et al. ............... 357/90
4,987,095 1/1991 Batey et al. ................ 357/23.15
5,019,882 5/1991 Solomon ..................... 357/22

FOREIGN PATENT DOCUMENTS 58-103131 6/1983 Japan ......................... 437/184
63-252478 10/1988 Japan ......................... 357/23.2
2-71563 3/1990 Japan ......................... 357/23.2

OTHER PUBLICATIONS

Electronics Letters, Aug. 4, 1988, vol. 24, No. 16, "Electrical and Microstructural Characterization of an Ultrathin Silicon Interlayer used in a Silicon Dioxide/-Germanium-Based MIS Structure", pp. 1010-1011, by Fountain et al.
Electronics Letters, Sep. 1, 1988, vol. 24 No. 18, "GaAs MIS structures with SiO$_2$ using a thin silicon interlayer" pp. 1134-1135, by Fountain et al.
Appl. Phys. Lett. 52(21) May 23, 1988, "Metal contacts to GaAs with lev Schotky barrier height", pp. 1794-1796, by Waldrop et al.
Appl. Phys. Lett. 53(8), Aug. 22, 1988 "Gating of germanium surfaces using pseudomorphic silicon interlayers", pp. 692-694 by Vitkavage et al.

Primary Examiner—Rolf Hille
Assistant Examiner—Steven Loke
Attorney, Agent, or Firm—Oblon, Spivak, McClelland, Maier & Neustadt

[57] ABSTRACT

A semiconductor device including a single crystal semiconductor host material having a surface; an ultrathin pseudomorphic single crystal epitaxial interlayer formed on the surface of the host material, wherein the interlayer is formed of a material and has a thickness selected so that the material of the interlayer is elastically deformed on the surface of the host material to match the lattice constant of the interlayer material with the lattice constant of the host material; and a further material incompatible with the host material when interfaced directly with the host material, but compatible with the interlayer, provided on the interlayer and thereby interfaced with the host material to perform a predetermined function with respect to the interlayer and the host material. In a preferred embodiment, the host material is a material selected from the group consisting of Ge, GaAs, InSb, InP, group II-V compounds and alloys thereof; the interlayer material is formed of pseudomorphic silicon, having a thickness of approximately 10 Å and the further material is formed of SiO$_2$ or a conductive material.

5 Claims, 1 Drawing Sheet

SEMICONDUCTOR DEVICE HAVING A SEMICONDUCTOR SUBSTRATE INTERFACED TO A DISSIMILAR MATERIAL BY MEANS OF A SINGLE CRYSTAL PSEUDOMORPHIC INTERLAYER

BACKGROUND OF THE INVENTION

1. Field of the Invention

This invention relates to a semiconductor device in which a semiconductor substrate is interfaced with a dissimilar material which is generally incompatible therewith.

2. Discussion of Background

Semiconductor technology is in large measure based on material structures made up of dissimilar materials interfaced to form composite structures. Each material contributes to the overall performance of the structure in ways that depend on the basic properties of the particular material and the way in which the structure has been designed to use those properties. In addition, these structures very often have performance characteristics that depend not only on the basic properties of the individual materials, but also on interactions between the individual materials at their interfaces. These interfacial (interactive) effects can dominate the performance of a given materials combination. In those circumstances, even though the individual material properties suggest that the materials can be combined to perform a useful function, nevertheless interfacial effects may cause the combination to perform in an unpredicted and very often non-useful manner.

If other materials can be chosen to perform the same function, and, if these combinations do not exhibit undesirable interfacial (interactive) effects, then the problem is solved. There are, however, important cases where no alternative materials combinations have been demonstrated. In these cases individual materials with the correct properties are known, but they have yet to be combined without substantial compromise of the expected performance due to undesirable interfacial (interactive) effects in the composite structure.

One example of the above problem is found in an important class of electronic devices which depend on modulation of the surface potential of a semiconductor to control the operation of an electronic device. This group of devices includes, but it is not limited to, Field Effect Transistors (FETs) (of many types) Metal Insulator Semiconductor (MIS) capacitors, and Charge Coupled Devices (CCDs). In these applications control of the surface potential is an active component of the device operation.

Another class of electronic devices requires control of the surface properties of a semiconductor in a different sense. In these devices control of the surface potential does not play an active role in the device operation, but it does play an important role in the stability and optimization of the device performance characteristics. This class of devices requires passivation of one or more interfaces of the active device. This category includes but is not limited to bipolar transistors (of many types), where uncontrolled changes in the properties of the surface lead to undesirable changes in device performance. These applications depend on stabilization of the surface properties of the semiconductor over the entire range of fabrication and operating conditions. This is termed surface passivation.

Individual devices may require both active and passive control of the surface potential. This is true in a Metal Oxide Semiconductor Field Effect Transistor (MOSFET).

Another class of applications occurs when multiple devices are integrated in the same block of semiconductor material. Areas of the surface of that semiconductor not occupied by active elements need to be similarly passivated to ensure operational stability of the adjacent active devices. This is characteristic of the so called "field" areas of an integrated circuit.

For each of the applications outlined above, silicon can be directly oxidized to form silicon dioxide. Silicon dioxide forms an excellent interface with silicon. The properties of the silicon/silicon dioxide interface are suitable for both active applications, such as gate insulator structures for FETs, as well as passive applications, such as discrete device or circuit passivation. This fact has been critically important in the development of the silicon-based electronics industry.

For some time substantial interest and activity has centered around other semiconductor materials, such as Ge, GaAs and its alloys, and other III-V compounds such as InSb and InP. These materials offer performance advantages with respect to silicon or can serve in applications where silicon can not. Unfortunately these materials, of which GaAs is illustrative, have not been passivated by oxidation or other direct chemical reactions of the host semiconductor surface. For these materials oxidation or similar processes that react the semiconductor constituent(s) lead to unstable interfacial properties.

Several factors can contribute to this instability. For example in GaAs the oxides of Ga and As are chemically unstable under normal conditions experienced during fabrication or operation of the device. In addition to these chemical instabilities these oxides do not have electrical properties comparable to those of silicon dioxide. These properties include resistivity, bulk trap density, interface state density with the parent material, breakdown field, radiation induced trapping, wearout and other hot carrier effects. Thus these oxides can not be used as gate insulators for higher performance FET structures. These problems are characteristic of the oxides themselves, independent of the technology used to form the oxides. Along with the poor performance of these oxides for electronic applications, the oxidation process degrades the surface of the GaAs. In particular, arsenic is preferentially removed from the GaAs surface during oxidation. This typically results in a thin layer of elemental arsenic at the interface between the oxides and the semiconducting GaAs. The arsenic deficient GaAs surface has electronic properties that will not allow many types of devices to work, particularly MIS-FETs (metal Insulator Semiconductor Field Effect Transistors).

In spite of substantial research efforts over the years, up to and including the present time, direct chemical reaction of the surface of these alternative semiconductor materials has not yielded an insulator/semiconductor materials technology approaching the performance of silicon-silicon dioxide technology for electronic device applications. Part of this problem lies in the extreme reactivity of these semiconductor surfaces. Thus, even insulator deposition technologies, that by design seek to avoid interfacial reactions, result in some unintentional reactions which dominate the electronic properties of the deposited structure.

SUMMARY OF THE INVENTION

Accordingly, one object of this invention is to provide a new and improved semiconductor device based on a host semiconductor material other than silicon, which solves the problem in the prior art of employing such a host material in a composite structure with a further material generally incompatible with the host material, thereby to take advantage of predetermined properties, characteristics and/or effects of the composite structure.

Another object of this invention is to provide a new and improved semiconductor device in which a host semiconductor material is interfaced with a generally incompatible further material to produce a composite structure having application to MOSFET, MISFET, MESFET, CCD, DRAM etc., structures and exhibiting improved operating characteristics.

These and other objects are achieved according to the present invention by providing a new and improved semiconductor device including a single crystal semiconductor host material having a surface; an ultrathin pseudomorphic single crystal epitaxial interlayer formed on the surface of the host material, the interlayer formed of a material and having a thickness selected so that the material of the interlayer is elastically deformed on the surface of the host material to match the lattice constant of the interlayer material with the lattice constant of the host material; and a further material incompatible with the host material when interfaced directly with the host material, but compatible with the interlayer, provided on the interlayer and thereby interfaced with the host material to perform a predetermined function with respect to the interlayer and host material.

BRIEF DESCRIPTION OF THE DRAWINGS

A more complete appreciation of the invention and many of the attended advantages thereof will be readily obtained as the same becomes better understood by reference of the following detailed description when considered in connection with the accompanying drawing, wherein.

DETAILED DESCRIPTION OF THE PREFERRED EMBODIMENTS

Figure 1:
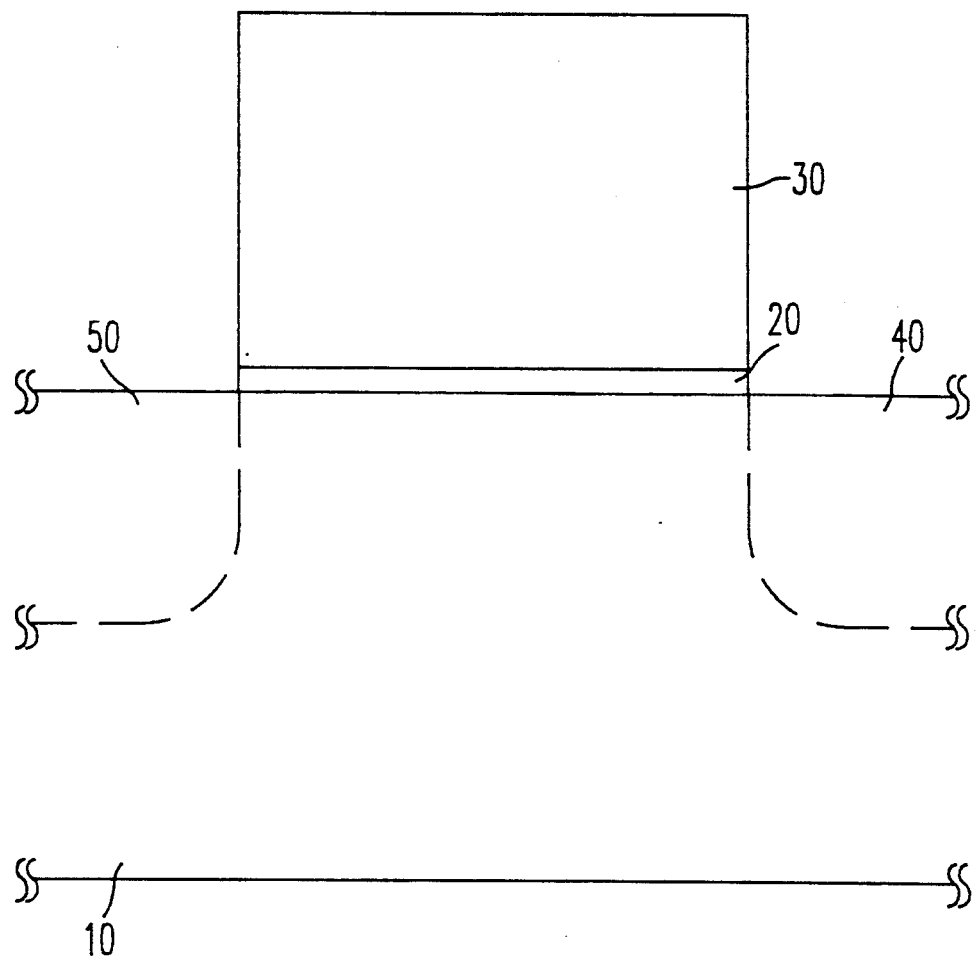
FIG. 1 is a schematic cross-sectional view of a semiconductor device according to the present invention.

One example of problem outline above is the application of a proven insulator such as silicon dioxide to GaAs, while avoiding the known electronic incompatibilities of these materials.

The essence of the invention is to insert a material between the GaAs and the $SiO_2$, for example. The material is chosen to prevent chemical reactions between the silicon dioxide layer and the GaAs surface. Such interactions, as discussed above, lead to undesirable interface properties. The chosen material must be chemically compatible with both GaAs and $SiO_2$. In addition to these chemical constraints, the material should not compromise the electrical performance of the structure.

One obvious choice for compatibility with $SiO_2$ is Si, as outlined above. To avoid compromise of the electrical properties of the insulator/semiconductor structure the silicon must have an epitaxial interface of high structural perfection with the GaAs. Because of the difference in lattice constant between Si (5.43 Å) and GaAs (5.656 Å), it is recognized in accordance with the present invention that an interface of high perfection requires the Si layer to be pseudomorphic with the GaAs. For pseudomorphic growth, a single crystal, epitaxial layer of silicon will form which elastically distorts to match the GaAs lattice constant in the plane of the silicon-GaAs interface. For the very thin layers in this design ($t \simeq 10$ Å), plastic yield will not occur. The structural constraints that require the silicon layer to be ultrathin are consistent with a design goal that the silicon only control the properties of the silicon dioxide/GaAs interface. Ideally the silicon layer would be continuous film one monolayer thick. All Ga and As bonds at the interface would be terminated on silicon atoms. No oxygen-Ga or oxygen-As bonds would form. The structures studied to date have used a pseudomorphic Si layer somewhat thicker, ($\simeq 10$ Å). Practically speaking, unless it is desired to produce an interface that exhibits the properties of a heterostructure containing a discrete Si layer, the thickness of the pseudomorphic Si layer should be a small fraction of De Broglie wavelength of the free carriers of interest.

The typical structure of the invention is grammatically shown in FIG. 1 to include a host material 10 having an ultra thin pseudomorphic interlayer 20 formed thereon. Formed on top of the interlayer 20 is a further layer 30 which is interfaced to the host material 10 by the interlayer 20. The host material 10 is typically Ge or GaAs; the interlayer 20 is typically silicon, and the further layer is typically $SiO_2$, but can be a conductive material when forming a Schottky barrier electrode. As is also schematically shown in FIG. 1 by means of the dash line, the composite structure can form an FET by the addition of source and drain regions 40 and 50.

Remote Plasma Enhanced Chemical Vapor Deposition has been proven to be effective in the growth of this composite insulator semiconductor structure.

Given the successful formation of an ultrathin, pseudomorphic epitaxial Si layer on the GaAs surface, followed by the deposition of $SiO_2$, the present invention has achieved a structure that avoids the interfacial problems outlined above.

In addition to the $SiO_2$/pseudomorphis Si/GaAs structure above discussed, the present invention is applicable to Ge and other III-V compounds such as InSb and InP and alloys thereof.

With respect to $SiO_2$/pseudomorphic Si/Ge structures, the Ge surface after direct chemical reaction such as oxidation or nitridation shows similar instabilities as detailed for GaAs above. These include chemical instability of the oxides of Ge, as well as thermal and electrical instabilities. Thus while the detailed physical chemistry for the two cases is different, the practical effect is the same. Prior to the present invention, no insulator/Ge technology has been developed that will support a Ge-based MISFET technology.

The approach of the present invention to this problem is a direct extension of the approach described above for GaAs. A pseudomorphic layer of silicon $\simeq 10$ Å thick is deposited on the Ge surface. This deposition is followed by the deposition of $SiO_2$. As in the GaAs case, the pseudomorphic Si separates the chemically incompatible $SiO_2$ and Ge. The thickness constraints governing the formation of the pseudomorphic interlayer are the same as outlined for the GaAs case above.

Remote Plasma Enhanced Chemical Vapor Deposition has been proven to be effective in the growth of this composite insulator semiconductor structure.

Given the successful formation of an ultrathin, epitaxial Si layer on the Ge surface, followed by the deposition of $SiO_2$, the present invention achieves a structure that avoids the problems outlined above.

GENERAL CASE

As described above for Ge and GaAs, the use of an ultrathin, high quality, pseudomorphic interlayer to separate chemically incompatible materials can be effective means to form high quality MIS structures for semiconductor device applications. The concept developed here is in no way restricted to the Ge and GaAs, but also applies to other III-V compounds and alloys thereof. The insulator used need not be silicon dioxide, and the pseudomorphic interlayer need not be Si.

In fact the present invention extends beyond MIS structures. For example if pseudomorphic Si having a thickness less than 100 Å, preferably less than 20 Å, is deposited on Ge, it is then possible to deposit an electrode material on the silicon interlayer to form a Schottky barrier. This allows a Ge-based Metal Semiconductor Field Effect Transistor (MESFET) technology in which source and drain regions are formed in the germanium host material to define a channel region therebetween, with the electrode material formed over the channel region on the interlayer. This would not be practical without the silicon interlayer because the Schottky barrier height on Ge is insufficient for practical circuit applications. Similarly use of an ultrathin, high quality, pseudomorphic Si interlayer for GaAs MESFET technology could be expected to improve the reproducibility of the Schottky barrier height thereby reducing the threshold voltage variation. Or, proper selection of the pseudomorphic material could be used to controllably alter the Schottky barrier height. It is important to recognize that in these FET applications the quality of the semiconductor-pseudomorphic semiconductor interface is important if degradation of the carrier transport properties of the semiconductor under the Schottky gate is to be avoided.

Most generally then, the present invention uses of ultrathin, high quality, pseudomorphic interlayers to separate incompatible materials used in semiconductor electronic applications. Thus, in the present invention the provision of a pseudomorphic interlayer is extremely important. Pseudomorphism allows obtaining high structural perfection of the interface without being limited to lattice matched materials. Thus the range of potential application is greatly expanded.

Ultrathin, pseudomorphic layers provide an additional advantage in the design of the performance characteristics of the interface. This is based on the fact that the properties of an ultrathin pseudomorphic layer are physically different from the properties of bulk material of the same composition. In a pseudomorphic layer of silicon 10 Å thick grown on GaAs, the pseudomorphic silicon layer has a lattice constant different from bulk silicon and a crystal symmetry different from bulk silicon. The associated changes in silicon bond length and bond angle change the most basic properties of the material. These include band gaps and effective masses, which are critical parameters in determining the electronic properties of a material. These changes can be used as an additional degree of freedom in engineering the composite interface.

The importance of these effects and their utility in optimizing the performance of these structures will depend in detail on the degree of lattice mismatch, and the physical properties of the materials.

By way of non-exhaustive examples, various uses of an ultrathin ($\simeq 10$ Å high quality pseudomorphic silicon interface to separate $SiO_2$ and GaAs or Ge are:

(1) to allow the formation of GaAs-based or Ge-based MISFET structures;
(2) to allow the formation of GaAs-based or Ge-based CCD structures;
(3) to allow the formation of GaAs-based or Ge-based MIS storage capacitors such as are required for dynamic random access memory (DRAM) technology;
(4) to allow surface passivation of GaAs-based or GE-based devices such as bipolar transistors and heterojunction bipolar transistors, MESFETs, and others; and
(5) to allow passivation of the GaAs or Ge surface in areas that do not contain active devices such as occur in integrated circuit applications.

More generally, the present invention is directed to semiconductor devices having an ultrathin ($\simeq 10$ Å), high quality pseudomorphic interlayer to separate an insulator from the host semiconductor (single crystal) surface, thereby enhancing the overall performance of the resultant structure over the performance obtained for the same insulator and host semiconductor directly interfaced (i.e. with no pseudomorphic interlayer), and by so doing to form:

high performance MISFET structures;
high performance CCD structures;
high performance MIS storage capacitors such as required by dynamic random access memory (DRAM) technology;
a composite structure for surface passivation applicable to but not restricted to bipolar transistors, heterojunction bipolar transistors, and MESFETs; and/or
a composite structure for surface passivation in areas of a chip that do not contain active devices such as the "field" areas of integrated circuits.

The present invention is further directed to semiconductor devices having an ultrathin ($\simeq 10$ Å), high quality pseudomorphic silicon interlayer separating a GaAs or Ge surface from a Schottky barrier electrode material, thereby:

controllably altering the barrier height as compared to the barrier height obtained by directly interfacing GaAs or Ge with the same Schottky barrier electrode material;
enhancing the transport characteristics of the underlying channel in FET applications, as compared to the same transport characteristics observed in structures formed by directly interfacing GaAs or Ge and the same Schottky barrier electrode material; and/or
controlling variations, such as variations over the area of a single wafer, variations from one process run to another, variations as a result of the effect(s) of subsequent process steps for circuit or discrete device fabrication, and variations due to device operating parameters or environments, in barrier height as compared to the variation in barrier height observed when GaAs or Ge and the same Schottky barrier electrode material are directly interfaced.

More generally, the present invention is directed to semiconductor devices having an ultrathin ($\simeq 10$ Å), high quality pseudomorphic interlayer separating an electrode material from a host semiconductor (single crystal) surface, thereby reducing the variation in the resultant Schottky barrier height or controllably altering the resultant Schottky barrier height compared to the variation obtained for the same electrode material and host semiconductor directly interfaced (i.e. with no pseudomorphic interlayer), and by so doing forming a composite structure to enhance the performance of MESFETs and Schottky diodes in both discrete device and integrated circuit applications.

Along these lines, the present invention is further directed to a semiconductor device having an ultrathin ($\simeq 10$ Å), high quality pseudomorphic interlayer separating an electrode material from a host semiconductor (single crystal) surface, thereby enhancing the carrier mobility, velocity and overall transport characteristics under the resultant Schottky barrier as compared to the same characteristics obtained for the same electrode material and host semiconductor directly interfaced (i.e. with no pseudomorphic interlayer), and by so doing forming a composite structure to enhance the performance of MESFETs, in both discrete device and integrated circuit applications.

Thus, in its most general form the present invention is directed to a semiconductor device having an ultrathin ($\simeq 10$ Å), high quality pseudomorphic interlayer separating a material from a host semiconductor (single crystal) surface, thereby enhancing the performance characteristics of the composite structure as compared to the same performance characteristics measured on a structure formed by directly interfacing (i.e. with no pseudomorphic interlayer) the same material and the same semiconductor, and by so doing forming a composite structure with enhanced performance in electronic applications. The performance enhancement relates to the initial (beginning of life performance of the composite structure) and/or to the stability of the performance characteristics of the composite structure over time and as a function of the operational parameters and environment.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A semiconductor device comprising:
   a single crystal germanium semiconductor host material having a surface;
   a pseudomorphic single crystal epitaxial silicon interlayer formed on the surface of said germanium host material, said silicon interlayer having a thickness selected so that the silicon interlayer is elastically deformed on the surface of the germanium host material substantially without any plastic deformation so as to match the lattice constant of the silicon interlayer with the lattice constant of the germanium host material; and
   a conductive material forming a Schottky barrier electrode provided on the silicon interlayer and thereby interfaced with the host material to perform a predetermined function with respect to said silicon interlayer and said germanium host material.

2. The device of claim 1, further comprising:
   source and drain regions formed in said germanium host material, wherein said source and drain regions, said germanium host material, said silicon interlayer and said conductive material forming said Schottky barrier electrode form a metal semiconductor field effect transistor (MESFET).

3. A device according to claims 1 or 2, wherein the thickness of said interlayer is less than 100 Å.

4. A device according to claim 3, wherein the thickness of said interlayer is less than 20 Å.

5. A device according to claim 4, wherein the thickness of said interlayer is approximately 10 Å.

* * * * *